(12) United States Patent
Luoh et al.

(10) Patent No.: US 8,383,515 B2
(45) Date of Patent: Feb. 26, 2013

(54) METHODOLOGY FOR WORDLINE SHORT REDUCTION

(75) Inventors: Tuung Luoh, Hsin-chu (TW); Ling-Wu Yang, Hsin-chu (TW); Tahone Yang, Hsin-chu (TW); Kuang-Chao Chen, Hsin-chu (TW)

(73) Assignee: Macronix International Co., Ltd., Taipei (TW)

( * ) Notice: Subject to any disclaimer, the term of this patent is extended or adjusted under 35 U.S.C. 154(b) by 0 days.

(21) Appl. No.: 12/947,309

(22) Filed: Nov. 16, 2010

(65) Prior Publication Data

US 2012/0122296 A1    May 17, 2012

(51) Int. Cl.
*H01L 21/44* (2006.01)

(52) U.S. Cl. .................. 438/684; 257/E21.659

(58) Field of Classification Search .................. 438/684; 257/E21.659
See application file for complete search history.

(56) References Cited

U.S. PATENT DOCUMENTS

| | | | |
|---|---|---|---|
| 2006/0017093 A1* | 1/2006 | Kwon et al. | 257/315 |
| 2007/0087504 A1* | 4/2007 | Pham et al. | 438/257 |
| 2008/0220578 A1* | 9/2008 | Lee | 438/264 |
| 2009/0057735 A1* | 3/2009 | Beak et al. | 257/292 |
| 2009/0111255 A1* | 4/2009 | Eun et al. | 438/589 |

* cited by examiner

*Primary Examiner* — Kevin Parendo
(74) *Attorney, Agent, or Firm* — Volpe and Koenig, P.C.

(57) ABSTRACT

The method of forming a wordline is provided in the present invention. The proposed method includes steps of: (a) providing a plurality of SASTIs with a plurality of first POLY cells deposited thereon; and (b) depositing a first fill-in material having a relatively high etching rate oxide-like material in the plurality of SASTIs and on each side wall of the plurality of first POLY cells.

10 Claims, 6 Drawing Sheets

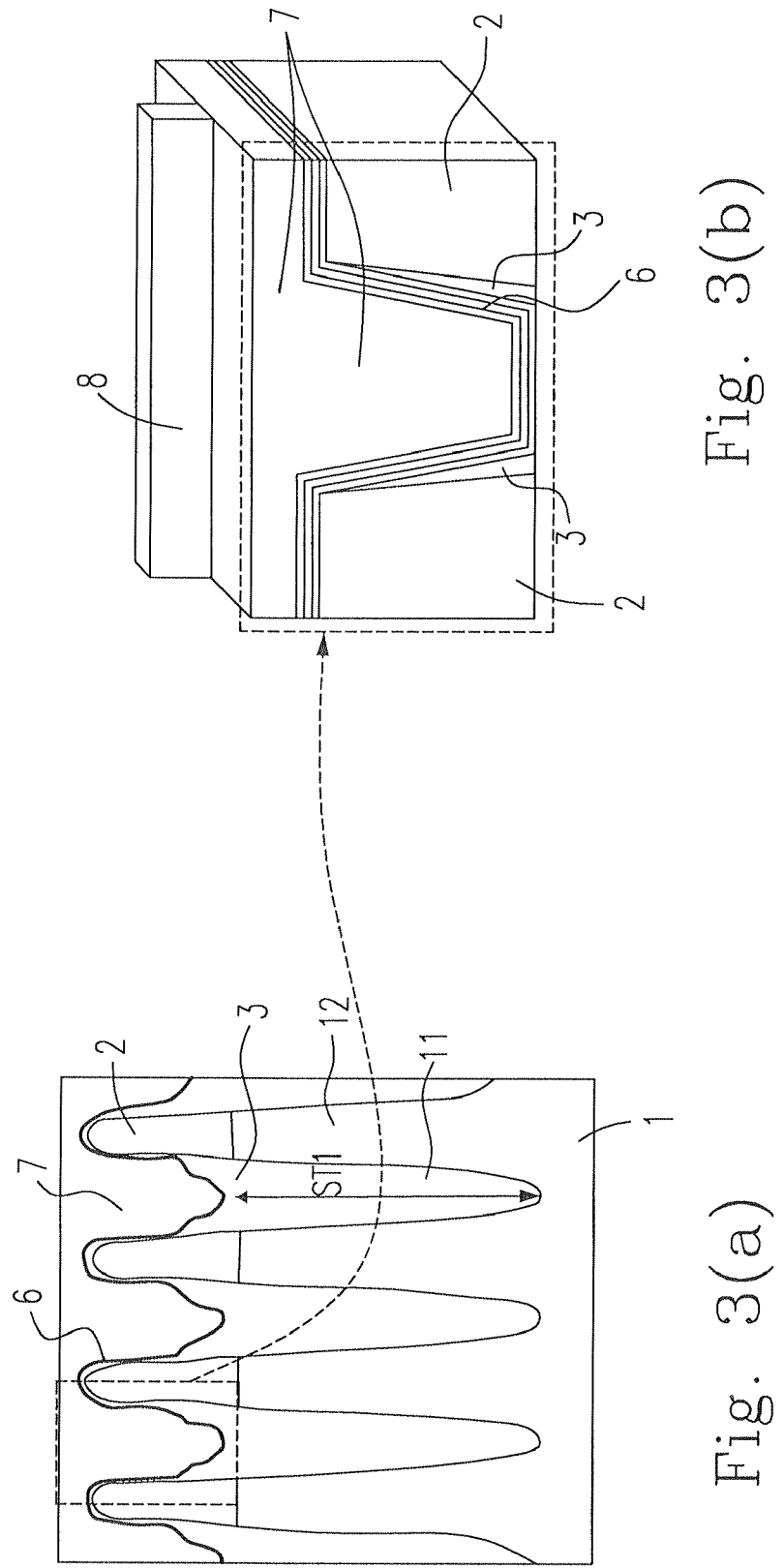

METHODOLOGY FOR WORDLINE SHORT REDUCTION

FIELD OF THE INVENTION

The present invention relates to a method of forming a semiconductor element (e.g., a wordline). More particularly, it relates to a method for reducing wordline short.

BACKGROUND OF THE INVENTION

Nowadays, semiconductor devices are frequently used in a variety of electronic applications, such as personal computers and cellular phones, for example. One such semiconductor device widely used in electronic systems for storing data is a semiconductor memory, and one common type of semiconductor memory is a flash memory (e.g., a NOR flash and a NAND flash).

Memory devices such as the NOR flash and the NAND flash are typically arranged in an array of memory cells. A flash memory cell typically includes an access field effect transistor (FET) and a storage capacitor. A source/drain region of the cell access FET is coupled to a bitline, and the other source/drain region is coupled to a plate of a respective storage capacitor. The other plate of the capacitor is coupled to a common plate reference voltage. The gate of the transistor is coupled to a wordline. The storing and accessing of information into and from memory cells are achieved by selecting and applying voltages to the wordlines and bitlines.

In fabricating semiconductor devices such as flash memories, shallow trench isolation (STI) is a technique used to provide electrical isolation between various devices. In a self-aligned STI (SASTI herein after) process, wordline short caused by a polycrystalline silicon (POLY) residual after wordline etching is a frequently encountered problem. It is easy to get wordline short caused by the POLY residual and the POLY profile. The present invention is aimed at solving the short-circuit problem caused by the POLY residual and the POLY profile not only in the process for fabricating a wordline, but also in other fabricating processes involving POLY residual problems such as in a fabricating process of the NAND flash, or the NOR flash, or a POLY cell bridge.

Keeping the drawbacks of the prior arts in mind, and employing experiments and research full-heartily and persistently, the applicants finally conceived a methodology for wordline short reduction.

SUMMARY OF THE INVENTION

It is therefore an object of the present invention to provide a method of forming a semiconductor element and a method of forming a wordline, each of which includes a step of depositing a relatively high etching rate oxide-like material at the side wall of each of the first POLY cells, such that the relatively high etching rate oxide-like material is easily removed together with the POLY residual after a POLY etching such that the short-circuit problem caused by the POLY residual and the POLY profile such as the wordline short phenomena will be resolved.

According to the first aspect of the present invention, a method of forming a wordline includes steps of: (a) providing a plurality of SASTIs with a plurality of first POLY cells deposited thereon; (b) depositing a first fill-in material having a relatively high etching rate oxide-like material in the plurality of SASTIs; (c) etching back a portion of the first fill-in material in each of the plurality of SASTIs to form a relatively thin layer of the relatively high etching rate oxide-like material deposited on each side wall of the plurality of first POLY cells; (d) depositing a second fill-in material upon the remaining first fill-in material and the plurality of first POLY cells; (e) depositing a second POLY layer upon the second fill-in material; (f) etching back a portion of the second POLY layer to form the wordline with a residual of the second POLY layer formed on an emerged portion of the second fill-in material; and (g) removing the residual of the second POLY layer, the emerged portion of the second fill-in material, and the relatively thin layer of the relatively high etching rate oxide-like material under the emerged second fill-in material before the emerged portion is emerged.

According to the second aspect of the present invention, a method of forming a wordline includes steps of: (a) providing a plurality of SASTIs with a plurality of first POLY cells deposited thereon; and (b) depositing a first fill-in material having a relatively high etching rate oxide-like material in the plurality of SASTIs and on each side wall of the plurality of first POLY cells.

According to the third aspect of the present invention, a method of forming a semiconductor element includes steps of: (a) providing a plurality of SASTIs with a plurality of first POLY cells deposited thereon; (b) depositing a first fill-in material having a relatively high etching rate oxide-like material in the trench and on each side wall of the first POLY cells; (c) depositing a second fill-in material upon the first fill-in material and the plurality of first POLY cells; (d) depositing a second POLY layer upon the second fill-in material; and (e) etching back a portion of the second POLY layer to form the semiconductor element.

The present invention may best be understood through the following descriptions with reference to the accompanying drawings, in which:

BRIEF DESCRIPTION OF THE DRAWINGS

FIG. 3(a) shows a schematic diagram of the proposed wordline fabricating process corresponding to a specific moment in time right after the step (e) of the provided method, according to the first preferred embodiment of the present invention;

FIG. 3(b) shows a schematic diagram of the proposed wordline fabricating process corresponding to a specific moment in time right before the step (f) of the provided method, according to the first preferred embodiment of the present invention;

DETAILED DESCRIPTION OF THE PREFERRED EMBODIMENT

As aforementioned, the present invention is aimed at solving the short-circuit problem caused by the POLY residual and the POLY profile not only in the process for fabricating a wordline, but also in other fabricating processes involving POLY residual problems such as in a fabricating process of a NAND flash, or a NOR flash, or a POLY cell bridge.

A critical issue of the present invention is to provide a step of depositing a relatively high etching rate oxide-like material at the side wall of each of the first POLY cells, and to use the difference between material etching rates to lift off the POLY residual altogether with the relatively high etching rate oxide-like material during a wet etching process such that a short-circuit problem like the wordline short failure induced by POLY residual and POLY profile could be easily solved.

The proposed method of forming a wordline according to the preferred embodiment (such as in an SASTI process) of the present invention comprises steps of: (a) providing a plurality of SASTIs with a plurality of first POLY cells deposited therebetween; (b) depositing a first fill-in material comprising a relatively high etching rate oxide-like material in the plurality of SASTIs; (c) etching back a portion of the first fill-in material in each of the plurality of SASTIs to form a relatively thin layer of the relatively high etching rate oxide-like material deposited on each side wall of the plurality of first POLY cells; (d) depositing a second fill-in material upon the remaining first fill-in material and the plurality of first POLY cells; (e) depositing a second POLY layer upon the second fill-in material; (f) etching back a portion of the second POLY layer to form the wordline with a residual of the second POLY layer formed on an emerged portion of the second fill-in material; and (g) removing the residual of the second POLY layer, the emerged portion of the second fill-in material, and the relatively thin layer of the relatively high etching rate oxide-like material under the emerged second fill-in material.

The proposed step (c) further comprises steps of: (c1) forming a silicon-nitride cell on each of the plurality of first poly cells; (c2) depositing an HDP oxide layer thereon; (c3) removing a portion of the HDP oxide layer, all the caps and a portion of each the silicon-nitride cell to form a nitride hard mask on top of each of the plurality of first poly cells by a chemical and mechanical polishing (CMP) process; (c4) removing all of the nitride hard masks by a first wet etch process; and (c5) removing all of the remaining HDP oxide layer by an array dry etch process and a second wet etch process.

Figure 1:
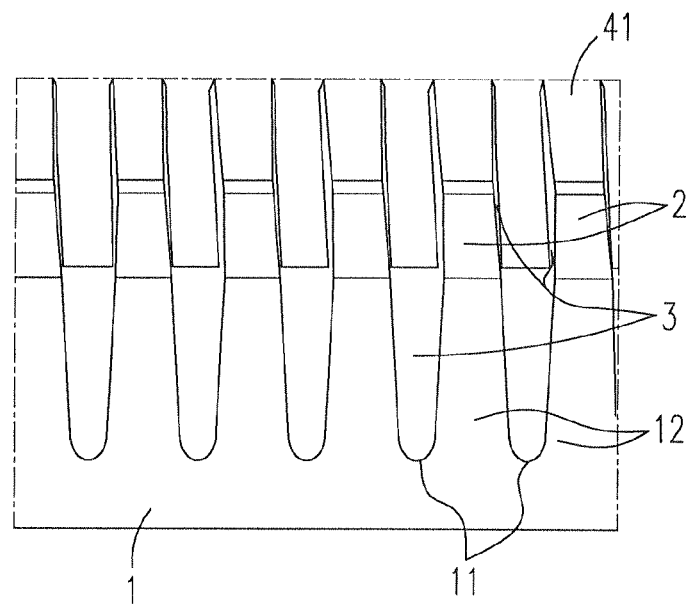
FIG. 1 shows a 3D schematic diagram of the proposed wordline fabricating process, corresponding to a specific moment in time right after the step (c1) of the provided method, according to the first preferred embodiment of the present invention.

FIG. 1 shows a 3D schematic diagram of the proposed wordline fabricating process (e.g., SASTI), corresponding to a specific moment in time right after the step (c1) of the provided method, according to the first preferred embodiment of the present invention. In FIG. 1, it shows the semiconductor substrate 1, the plurality of SASTIs 11, the adjacent segments of the semiconductor substrate 12, the first poly cell 2, the relatively high etching rate oxide-like material 3, and a plurality of nitride cells 41 (comprising the silicon-nitride) of the step (c1) (see FIG. 2(a)).

Figure 2A:
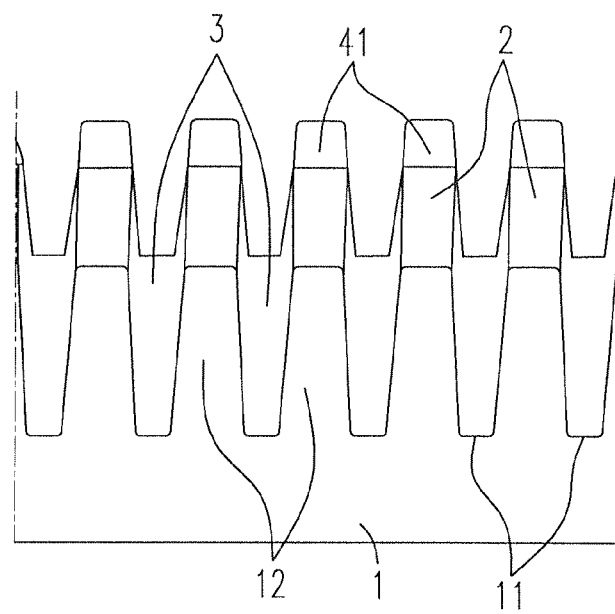
FIG. 2(a) shows a 2D schematic diagram of the proposed wordline fabricating process corresponding to a specific moment in time right after the step (c1) of the provided method, according to the first preferred embodiment of the present invention.

FIG. 2(a) shows a 2D schematic diagram of the proposed wordline fabricating process corresponding to a specific moment in time right after the step (c1) of the provided method, according to the first preferred embodiment of the present invention. In FIG. 2(a), it shows the silicon-nitride cell 41 forming on each of the plurality of first poly cells 2 (of the step (c1)).

Figure 2B:
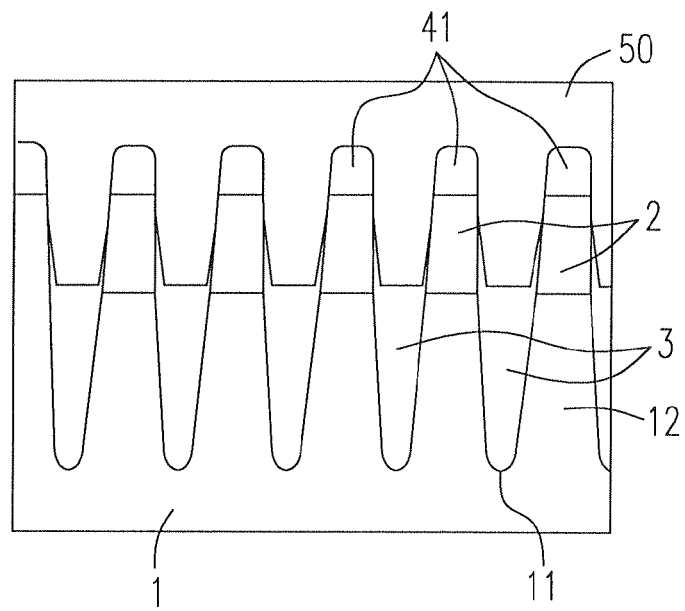
FIG. 2(b) shows a schematic diagram of the proposed wordline fabricating process corresponding to a specific moment in time right after the step (c3) of the provided method, according to the first preferred embodiment of the present invention.

FIG. 2(b) shows a schematic diagram of the proposed wordline fabricating process corresponding to a specific moment in time right after the step (c2) of the provided method, according to the first preferred embodiment of the present invention. In FIG. 2(b), it shows the silicon-nitride cell 41 (of the step (c1)) and the HDP oxide layer 50 deposited thereon (of the step (c2)).

Figure 2C:
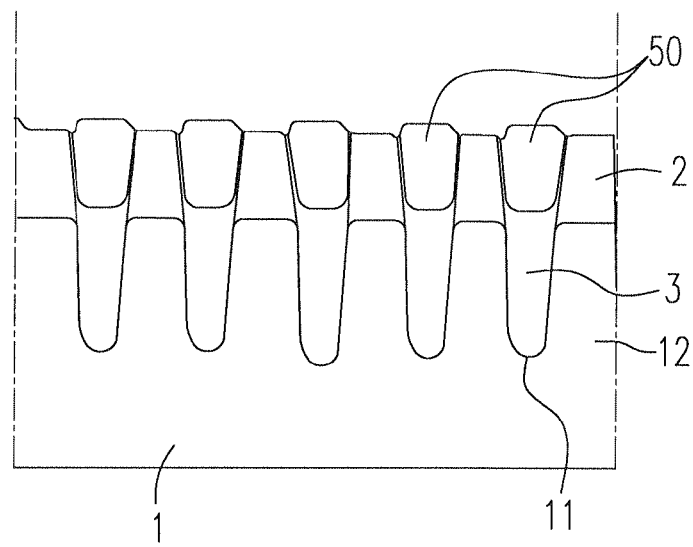
FIG. 2(c) shows a schematic diagram of the proposed wordline fabricating process corresponding to a specific moment in time right after the step (c5) of the provided method, according to the first preferred embodiment of the present invention.

FIG. 2(c) shows a schematic diagram of the proposed wordline fabricating process corresponding to a specific moment in time right after the step (c4) of the provided method, according to the first preferred embodiment of the present invention. In FIG. 2(c), it shows the remaining HDP oxide layer 50, the first POLY cell 2, the relatively high etching rate oxide-like material 3, the semiconductor substrate 1, the plurality of SASTIs 11, and the adjacent segments of the semiconductor substrate 12 (after a portion of the HDP oxide layer, and a portion of each the silicon-nitride cell are removed to form the nitride hard mask of the step (c3), and all the nitride hard masks (not shown) of the step (c4) are removed).

Figure 2D:
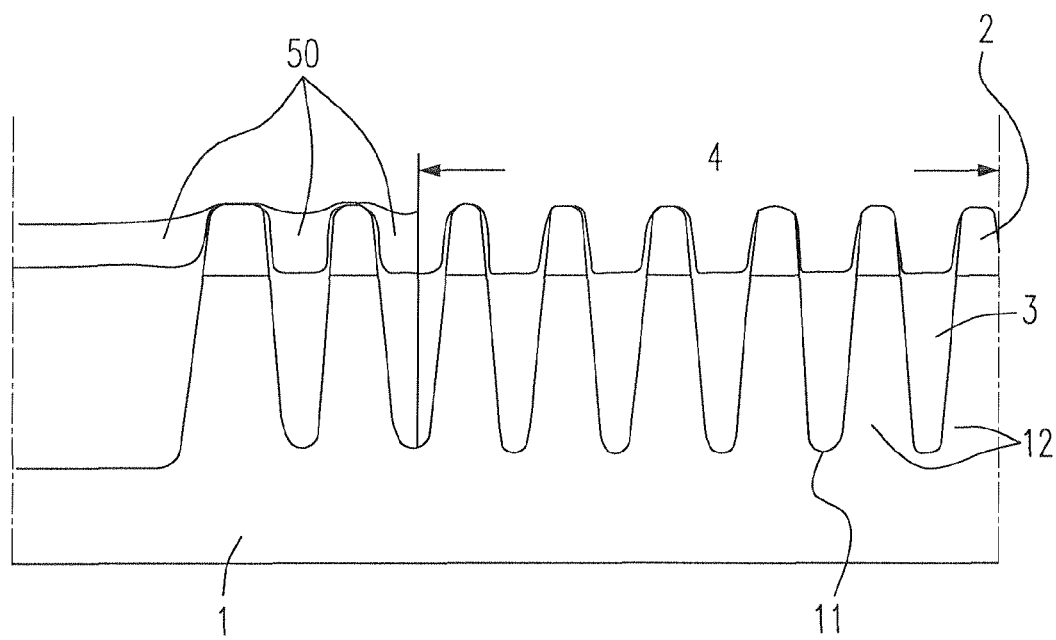
FIG. 2(d) shows a schematic diagram of the proposed wordline fabricating process corresponding to a specific moment in time right after the step (c6) of the provided method, according to the first preferred embodiment of the present invention.

FIG. 2(d) shows a schematic diagram of the proposed wordline fabricating process corresponding to a specific moment in time right after the step (c5) of the provided method, according to the first preferred embodiment of the present invention. In FIG. 2(d), it shows all the remaining HDP oxide layers 50 among the operational area 4 are removed (of the step (c5)) and there are still some of the relatively high etching rate oxide-like material 3 attached at the side wall of each of the first POLY cells (e.g., according to array AEI (after etch inspection) of our experimental data).

Figure 3C:
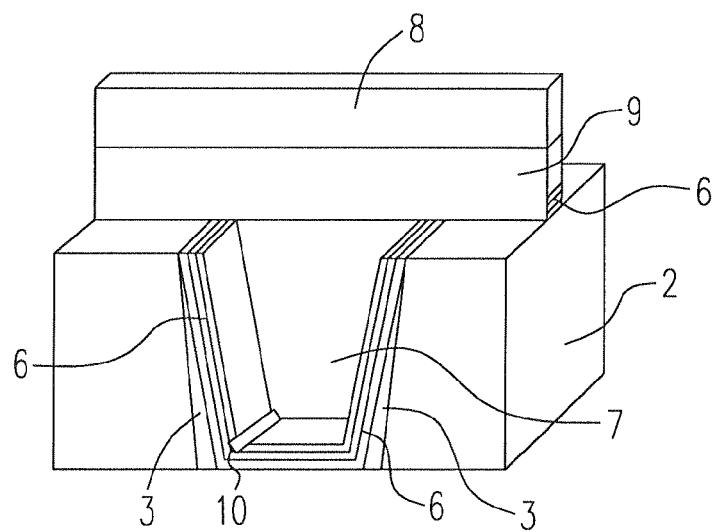
FIG. 3(c) shows a schematic diagram of the proposed wordline fabricating process corresponding to a specific moment in time right after the step (f3) of the provided method, according to the first preferred embodiment of the present invention.

FIG. 3(a) shows a schematic diagram of the proposed wordline fabricating process corresponding to a specific moment in time right after the step (e) of the provided method, according to the first preferred embodiment of the present invention. In FIG. 3(a), it shows a second fill-in material 6 is deposited upon the remaining first fill-in material 3 and the plurality of first POLY cells 2 (of the step (d)), and a second POLY layer 7 is deposited upon the second fill-in material 6 (of the step (e)), wherein a trench filled with the remaining first fill-in material 3 forms a shallow trench isolation (STI).

Figure 3D:
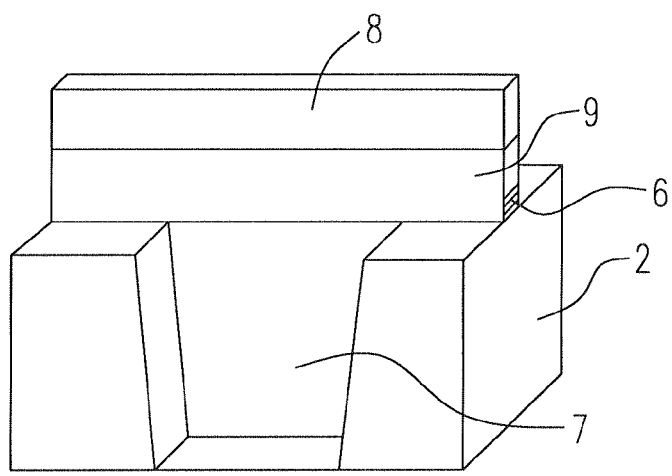
FIG. 3(d) shows a schematic diagram of the proposed wordline fabricating process corresponding to a specific moment in time right after the step (g) of the provided method, according to the first preferred embodiment of the present invention.

FIG. 3(b) shows a schematic diagram of the proposed wordline fabricating process comprising a specific area marked by dotted line-segments and corresponding to a specific area marked by dotted line-segments of FIG. 3(a) and a specific moment in time right before the step (f) of the provided method, according to the first preferred embodiment of the present invention. The step (f) further comprises steps of:

(f1) forming the wordline by a wordline patterning process; (f2) forming the emerged portion of the second fill-in material; and (f3) forming the residual of the second POLY layer on the emerged portion of the second fill-in material. The relatively high etching rate oxide-like material 3 is one selected from a group consisting of an HTO, an SAUSG, an SOG and a composite layer having a combination thereof. For example, the composite layer includes the SOG and the SAUSG. In another example, the relatively high etching rate oxide-like material is a composite layer including an HDP oxide, an SOG and an SAUSG. In a third example, the composite layer includes the SOG and the SAUSG. In FIG. 3(*b*), it shows that a wordline patterning 8 is mounted upon the second POLY layer 7 (of the step (f1)), the second fill-in material 6 includes a composite layer (e.g., it could be a silicon oxide/silicon nitride/silicon oxide structure (ONO)) deposited upon the remaining first fill-in material 3.

FIG. 3(*c*) shows a schematic diagram of the proposed wordline fabricating process corresponding to a specific moment in time right after the step (f3) of the provided method, according to the first preferred embodiment of the present invention. In FIG. 3(*c*), it shows that the wordline 9 is initially formed under the wordline patterning 8 (of the step (f2)), the emerged portion of the second fill-in material (e.g., an ONO) is emerged (of the step (f2)), and a residual 10 of the second POLY layer is formed on the emerged portion of the second fill-in material (of the step (f3)). The relatively high etching rate oxide-like material 3 has an etching rate faster than an etching rate of an HDP oxide film, and the relatively high etching rate oxide-like material 3 has an etching rate larger than 1.5 times of an etching rate of a thermal oxide. As aforementioned, a critical issue of the present invention is to use the difference between material etching rates to lift off the POLY residual 10 altogether with the relatively high etching rate oxide-like material during a wet etching process (of the step (g), as shown in FIG. 3(*d*)) such that a short-circuit problem like the wordline short failure induced by POLY residual and POLY profile could be easily solved.

According to the second preferred embodiment of the present invention, a method of forming a wordline could be simplified and includes steps of: (a) providing a plurality of SASTIs with a plurality of first POLY cells deposited thereon; and (b) depositing a first fill-in material having a relatively high etching rate oxide-like material in the plurality of SASTIs and on each side wall of the plurality of first POLY cells.

According to the second preferred embodiment of the present invention, the proposed method further comprises steps of: (c) depositing a second fill-in material upon the first fill-in material and the plurality of first POLY cells; (d) depositing a second POLY layer upon the second fill-in material; and (e) etching back a portion of the second POLY layer to form the wordline.

According to the second preferred embodiment of the present invention, the above-mentioned step (b) further comprises a step of (b1) etching back a portion of the first fill-in material in each of the plurality of SASTIs to form a relatively thin layer of the relatively high etching rate oxide-like material deposited on each side wall of the plurality of first POLY cells.

According to the second preferred embodiment of the present invention, the proposed method further comprises a step of (f) removing a residual of the second POLY layer, the second fill-in material and the relatively thin layer of the relatively high etching rate oxide-like material by a wet etch process.

According to the third preferred embodiment of the present invention, a method of forming a semiconductor element comprises steps of: (a) providing a plurality of SASTIs with a plurality of first POLY cells deposited thereon; (b) depositing a first fill-in material having a relatively high etching rate oxide-like material in the plurality of SASTIs and on each side wall of the first POLY cells; (c) depositing a second fill-in material upon the first fill-in material and the first POLY cells; (d) depositing a second POLY layer upon the second fill-in material; and (e) etching back a portion of the second POLY layer to form the semiconductor element.

According to the third preferred embodiment of the present invention, the aforementioned step (b) further comprises a step of (b1) etching back a portion of the first fill-in material in the plurality of SASTIs to form a relatively thin layer of the relatively high etching rate oxide-like material deposited on each side wall of the first POLY cells.

According to the third preferred embodiment of the present invention, the aforementioned method further comprises a step of (f) removing a residual of the second POLY layer, the second fill-in material and the relatively thin layer of the relatively high etching rate oxide-like material by a wet etch process.

Figure 4:
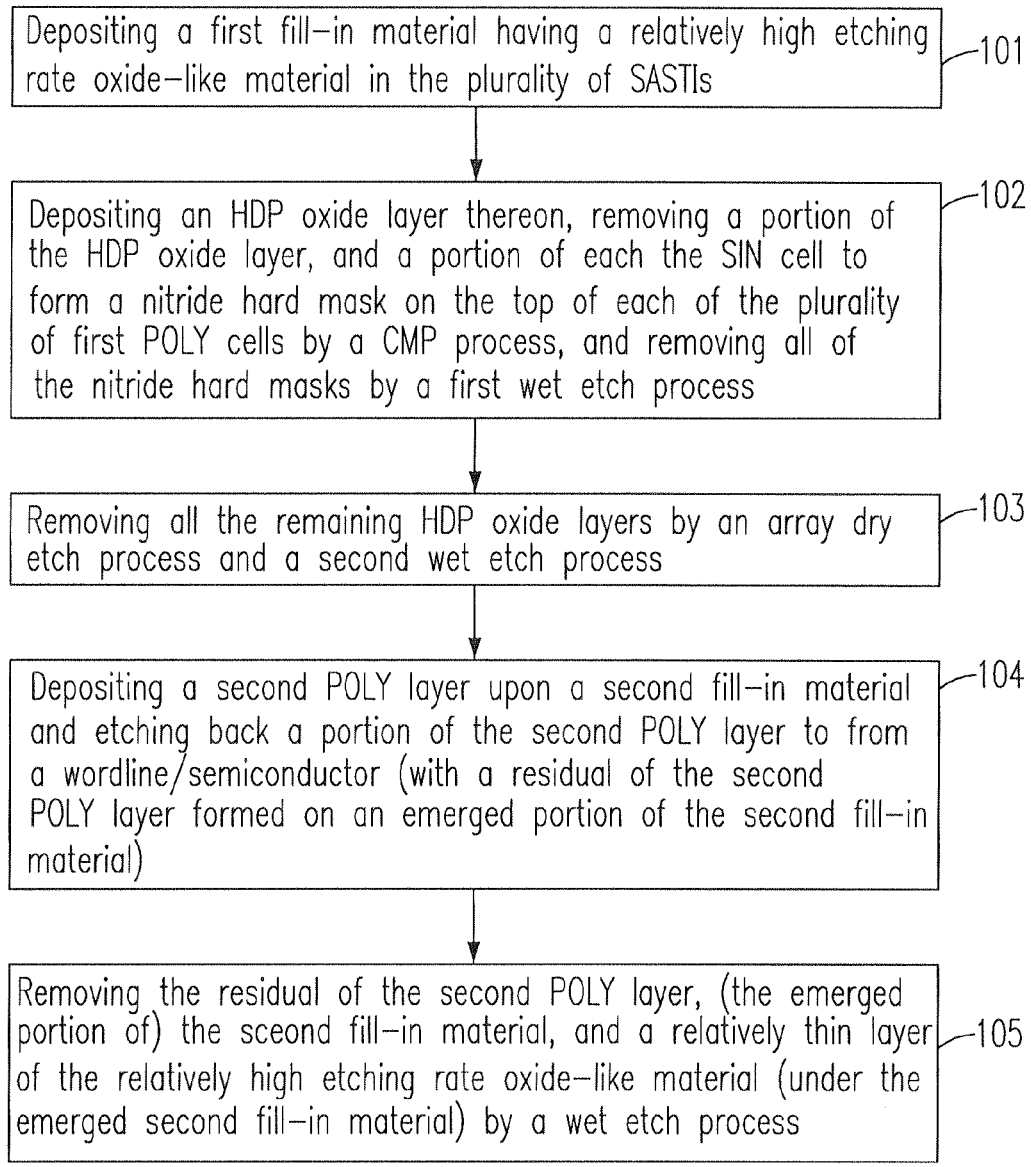
FIG. 4 shows a flow chart of the critical steps of the proposed methods according to the first to the third preferred embodiments of the present invention respectively.

FIG. 4 shows a flow chart of the critical steps of the proposed methods according to the first to the third preferred embodiments of the present invention respectively. Step 101 of FIG. 4 corresponds to the step (b) of the aforementioned methods according to the first to the third preferred embodiments. Step 102 of FIG. 4 corresponds to the steps (c2) to (c5) of the aforementioned method according to the first preferred embodiment of the present invention, wherein one of an HDP oxide and an oxide is used to form the cap and the SIN RMV being a silicon-nitride wet remove process corresponds to step (c4) of the above-mentioned method. Step 103 of FIG. 4 corresponds to the step (c5) of the aforementioned method according to the first preferred embodiment of the present invention. Step 104 of FIG. 4 corresponds to the respective steps of (e) and (f)/(d) to (f)/(d) to (f) of the aforementioned methods according to the first/second/third preferred embodiments of the present invention. Step 105 of FIG. 4 corresponds to the respective steps of (g)/(f)/(f) of the aforementioned methods according to the first/second/third preferred embodiments of the present invention.

According to the aforementioned descriptions, the present invention provides a method of forming a semiconductor element and a method of forming a wordline, each of which includes a step of depositing a relatively high etching rate oxide-like material at the side wall of each of the first POLY cells, such that the relatively high etching rate oxide-like material is easily removed together with the POLY residual after a POLY etching such that the short-circuit problem caused by the POLY residual and the POLY profile such as the wordline short phenomena will be solved.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims, which are to be accorded with the broadest interpretation so as to encompass all such modifications and similar structures. Therefore, the above description and illustration should not be taken as limiting the scope of the present invention which is defined by the appended claims.

What is claimed is:

1. A method of forming a wordline, comprising steps of:
   (a) providing a plurality of trenches with a plurality of first polycrystalline (POLY) cells, each of which is deposited between two neighboring ones of the plurality of trenches;
   (b) depositing a first fill-in material comprising an oxide material with a first etching rate in the plurality of trenches;
   (c) etching back a portion of the first fill-in material in each of the plurality of trenches to form a liner layer of the oxide material deposited on each side wall of the plurality of first POLY cells;
   (d) depositing a second fill-in material with a second etching rate upon the liner layer and the plurality of first POLY cells;
   (e) depositing a second POLY layer upon the second fill-in material;
   (f) etching back a portion of the second POLY layer to form the wordline with a residual of the second POLY layer formed on an exposed portion of the second fill-in material; and
   (g) removing the residual of the second POLY layer, the exposed portion of the second fill-in material, and the liner layer under the exposed portion of the second fill-in material.

2. A method according to claim 1, wherein the step (c) further comprises steps of: (c1) forming a silicon-nitride cell on each of the plurality of first POLY cells; (c2) depositing an HDP oxide layer thereon; (c3) removing a portion of the HDP oxide layer, and a portion of each the silicon-nitride cell to form a nitride hard mask on the top of each of the plurality of first POLY cells by a chemical and mechanical polishing (CMP) process; (c4) removing all of the nitride hard masks by a first wet etch process; and (c5) removing all the remaining HDP oxide layers by an array dry etch process and a second wet etch process.

3. A method according to claim 2, wherein the step (g) is performed by a wet etch process.

4. A method according to claim 1, wherein the second fill-in material comprises a silicon oxide/silicon nitride/silicon oxide structure (ONO).

5. A method according to claim 1, wherein the step (f) further comprises steps of: (f1) forming the wordline by a wordline patterning process; and (f2) forming the exposed portion of the second fill-in material.

6. A method according to claim 1, wherein the oxide material is one selected from a group consisting of an HTO, a sub-atmospheric undoped silicon glass (SAUSG), an SOG and a composite layer having a combination thereof.

7. A method according to claim 6, wherein the composite layer includes the SOG and the SAUSG.

8. A method according to claim 1, wherein the oxide material is a composite layer including an HDP oxide, an SOG and a sub-atmospheric undoped silicon glass (SAUSG).

9. A method according to claim 1, wherein the oxide material has an etching rate faster than an etching rate of an HDP oxide film.

10. A method according to claim 1, wherein the oxide material has an etching rate larger than 1.5 times of an etching rate of a thermal oxide.

* * * * *